United States Patent
Hecht, Jr. et al.

(10) Patent No.: US 7,359,458 B2
(45) Date of Patent: Apr. 15, 2008

(54) STRUCTURES AND METHODS FOR CAPTURING DATA FROM DATA BIT STREAMS

(75) Inventors: Theodore Hecht, Jr., Kernersville, NC (US); Tyre Paul Lanier, Kernersville, NC (US)

(73) Assignee: Analog Devices, Inc., Norwood, MA (US)

( * ) Notice: Subject to any disclaimer, the term of this patent is extended or adjusted under 35 U.S.C. 154(b) by 707 days.

(21) Appl. No.: 10/861,833

(22) Filed: Jun. 3, 2004

(65) Prior Publication Data

US 2005/0025260 A1     Feb. 3, 2005

Related U.S. Application Data

(60) Provisional application No. 60/491,611, filed on Jul. 31, 2003.

(51) Int. Cl.
*H03K 9/00* (2006.01)
(52) U.S. Cl. .................................................. 375/316
(58) Field of Classification Search ............... 375/316, 375/327, 330, 331, 332, 354, 355, 359, 363, 375/364, 368, 371, 373, 376; 370/534; 710/51; 714/747
See application file for complete search history.

(56) References Cited

U.S. PATENT DOCUMENTS

| | | | | |
|---|---|---|---|---|
| 5,905,769 A | 5/1999 | Lee et al. | ................... | 375/376 |
| 6,272,193 B1 | 8/2001 | Eglit | ................... | 375/356 |
| 6,463,092 B1 | 10/2002 | Kim et al. | ................... | 375/319 |
| 6,535,029 B2 | 3/2003 | Shih et al. | ................... | 327/65 |
| 6,545,688 B1 | 4/2003 | Loveridge et al. | ................... | 345/660 |
| 6,564,269 B1 | 5/2003 | Martin | ................... | 710/20 |
| 6,587,525 B2 | 7/2003 | Jeong et al. | | |

(Continued)

FOREIGN PATENT DOCUMENTS

EP     1209842 A     5/2002

(Continued)

OTHER PUBLICATIONS

Diniz, George, et al., "Bringing Displays into the Digital Future", EDN Magazine, Apr. 26, 2001, pp. 105-114.

(Continued)

*Primary Examiner*—Sam K. Ahn
(74) *Attorney, Agent, or Firm*—Koppel, Patrick, Heybl & Dawson

(57) ABSTRACT

Structures and methods are provided for capturing data from a data bit stream. They primarily generate successive bit sample sequences that each comprise N interleaved bit sample phases, identify subsampling strings formed of less than N consecutive bit samples with the same bit sample value, invalidate the bit sample phase of any bit sample that adjoins the strings, and then form data with successive bit sample phases that remain valid after the invalidating step. From more than one valid bit sample phases, they identify a preferred valid bit sample phase as one whose bit samples least often adjoin transitions from one bit sample value to a different bit sample value and then form the data with the preferred valid bit sample phase. Preferably, copies of the bit sample sequences are delayed along a delay path to facilitate the identifying and invalidating steps and subsequently, valid bit sample phases are multiplexed from the delay path.

26 Claims, 7 Drawing Sheets

U.S. PATENT DOCUMENTS 6,735,710 B1 5/2004 Yoshikawa .................. 713/500
2002/0027964 A1* 3/2002 Yoo et al. ................... 375/341

FOREIGN PATENT DOCUMENTS

JP 2001148692 A 3/2003

OTHER PUBLICATIONS

Lee et al., "A CMOS Serial Link for Fully Duplexed Data Communication", IEICE Transactions on Electronics, Institute of Electronics Information and Comm. Eng. Tokyo, Japan, vol. E78-C, No. 6 Jun. 1, 1995. pp. 601-611.

* cited by examiner

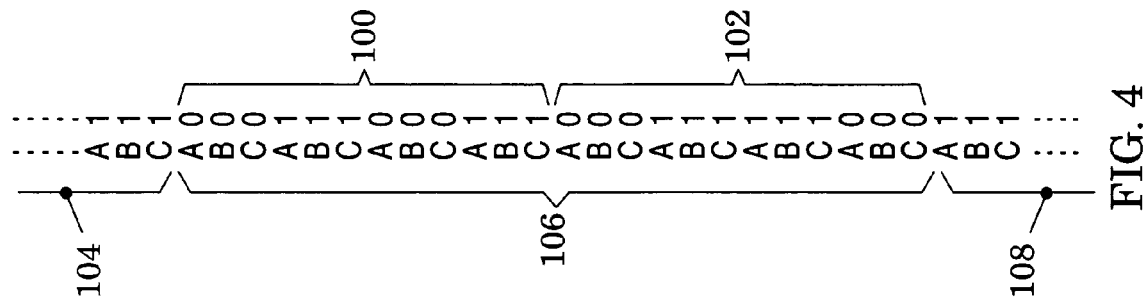
FIG. 4
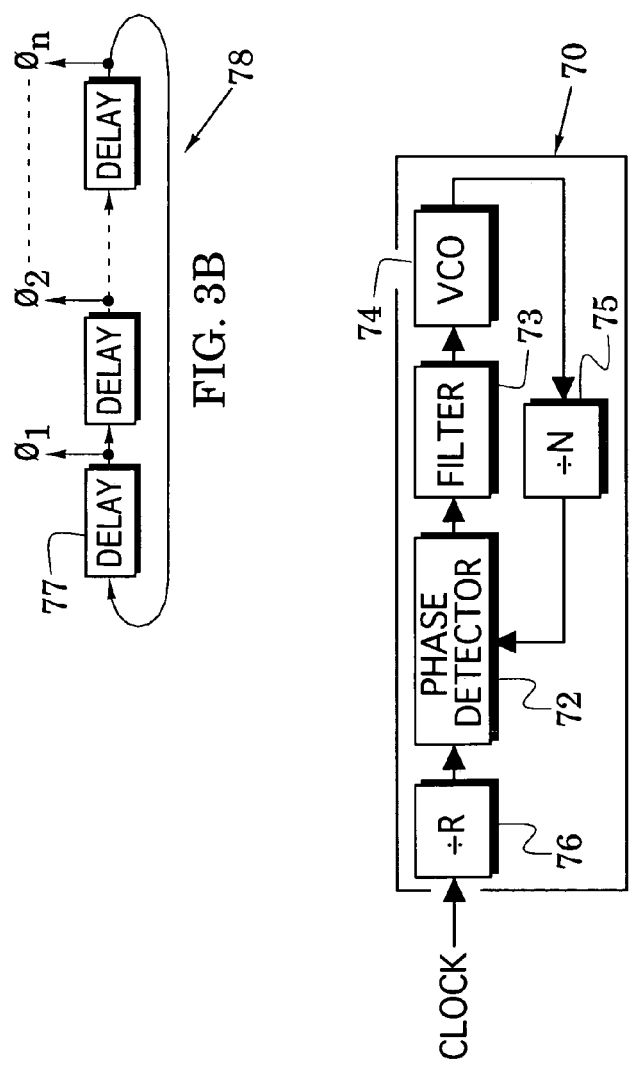
FIG. 3B
FIG. 3A

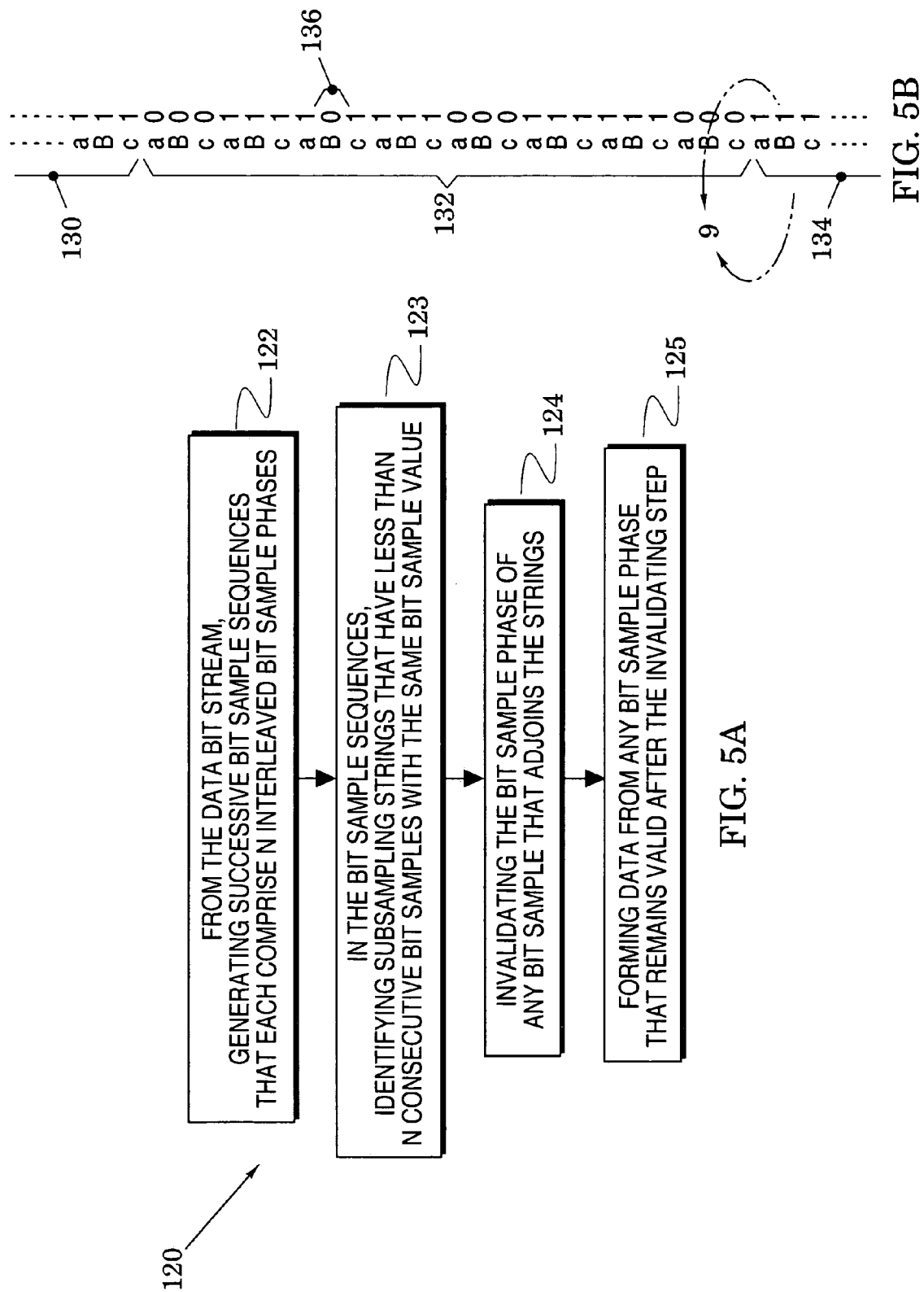

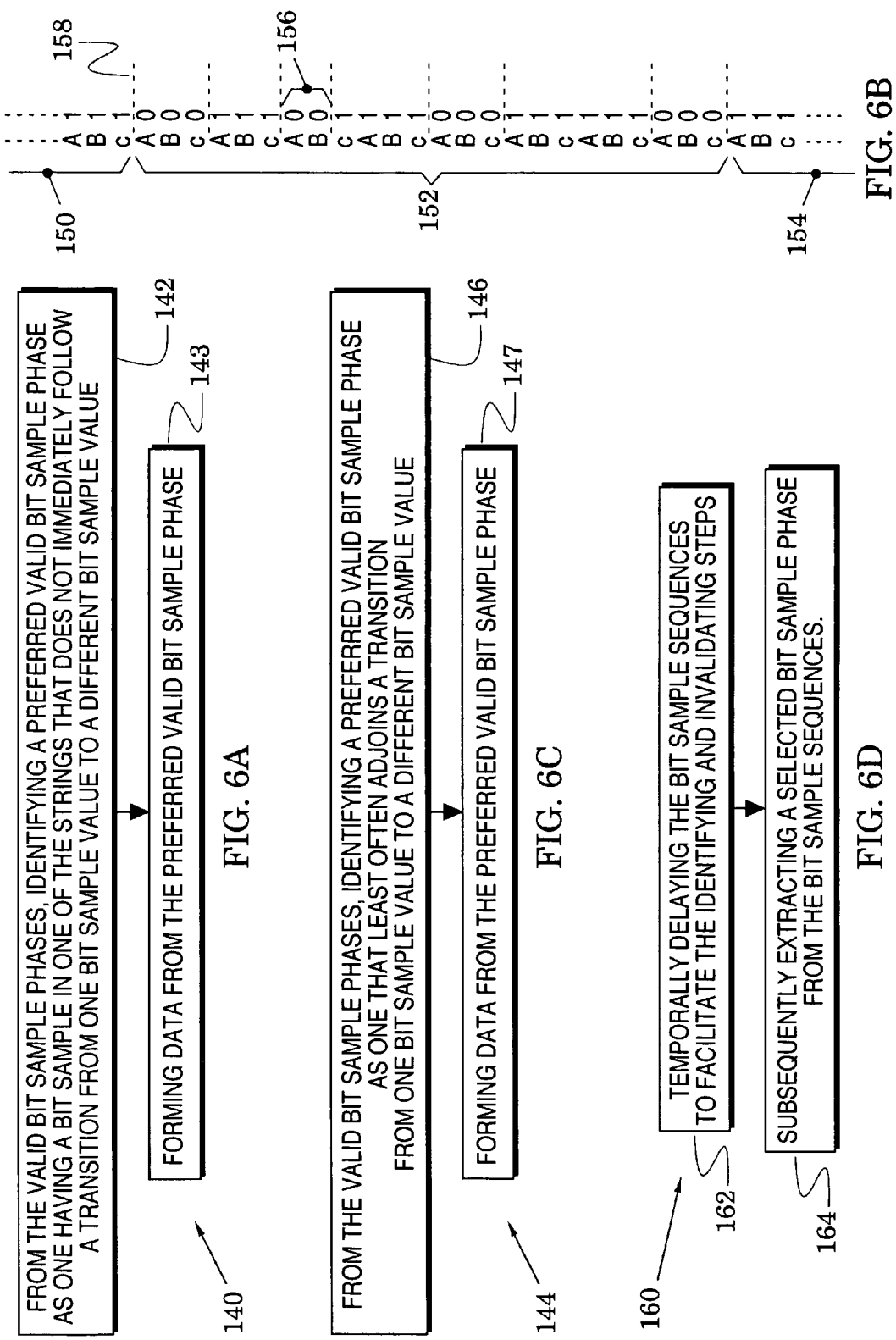

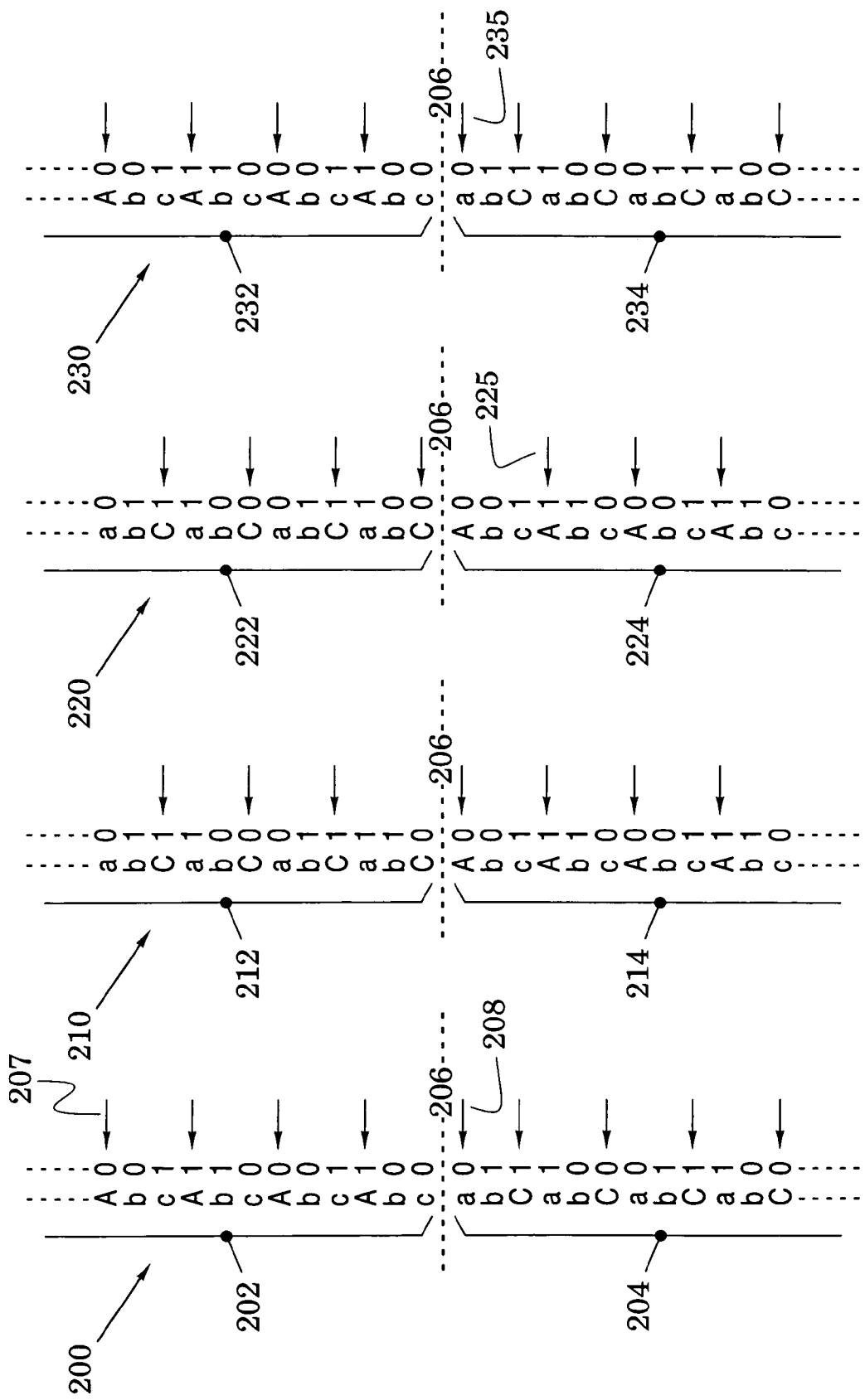

STRUCTURES AND METHODS FOR CAPTURING DATA FROM DATA BIT STREAMS

RELATED APPLICATION

This application claims the benefit of provisional application Ser. No. 60/491,611, filed Jul. 31, 2003 in the name of the same applicants.

BACKGROUND OF THE INVENTION

1. Field of the Invention

The present invention relates generally to the capture of data from data bit streams.

2. Description of the Related Art

The market for digital displays (e.g., flat-panel displays) has rapidly expanded in recent years. Because the existing base of cathode ray tubes require analog data, however, these digital displays must maintain compatibility with existing analog data interfaces along with the newer digital data interfaces. Accordingly, the Digital Display Working Group developed a digital-visual-interface (DVI) specification which controls the implementation of analog and digital data interfaces. The analog interface references the Video Electronics Standards Association (VESA) standard for computer displays and the digital interface references the transition-minimized-differential-signaling (TMDS) format in addition to others such as low-voltage differential signaling (LVDS) and gigabit video interface (GVIF).

DVI encodes original 8-bit graphics data to a TMDS stream of 10-bit dc-balanced, transition-minimized words. In particular, a DVI algorithm encodes the data to minimize transitions and adds a bit to indicate which of two methods was used to describe the transitions. The algorithm also effects an approximate DC balance for the data stream by selectively inverting words and then adding a tenth bit to indicate the inversion used. Data channels 0, 1 and 2 (e.g., red, green and blue data) are each carried on a respective one of three TMDS streams. Horizontal and vertical sync signals are coded on the blue channel during blanking periods and additional control information is generally coded on the red and green channels during the blanking periods.

Because each 8-bit graphics word has been converted to a 10-bit serial word, DVI data rates can be as high as 1.65 Ghz with transition times on the order of 100 picoseconds. Although the encoded data streams are generally carried in 50 ohm shielded twisted-pair cables and impedances along the cables are well matched to reduce reflections, the accurate detection of these narrow pulses and the corresponding capture of their encoded data is a challenging task.

BRIEF SUMMARY OF THE INVENTION

The present invention is directed to methods and structures that effectively capture data from data bit streams. The novel features of the invention are set forth with particularity in the appended claims. The invention will be best understood from the following description when read in conjunction with the accompanying drawings.

BRIEF DESCRIPTION OF THE DRAWINGS

FIGS. 3A and 3B are block diagrams of a clock generator embodiment in the decoder of FIG. 2;

FIG. 4 illustrates an exemplary bit sample sequence generated by a sampler and a phase aligner in the decoder of FIG. 2;

FIG. 5A is a flowchart that illustrates process embodiments in the decoder of FIG. 2 and FIG. 5B illustrates a corresponding bit sample sequence;

FIGS. 6A and 6D are flowcharts that illustrate further process embodiments in the decoder of FIG. 2, FIG. 6B illustrates a corresponding bit sample sequence, and FIG. 6C is another flowchart that illustrates other process embodiments;

FIGS. 9A-9D are illustrations of bit sample additions and deletions at bit sample sequence boundaries in the data capturer of FIG. 8

DETAILED DESCRIPTION OF THE INVENTION

The present invention provides data-capturing structures and methods that are particularly suited for display systems which require the capture of data from an incoming data bit stream. Basically, the data capture identifies subsampling strings in successive bit sample sequences that are formed by successive oversampling of the data bit stream. This identification is used to invalidate bit sample phases in the sequences so that remaining valid bit sample phases can be multiplexed from a corresponding delay path.

Figure 1:
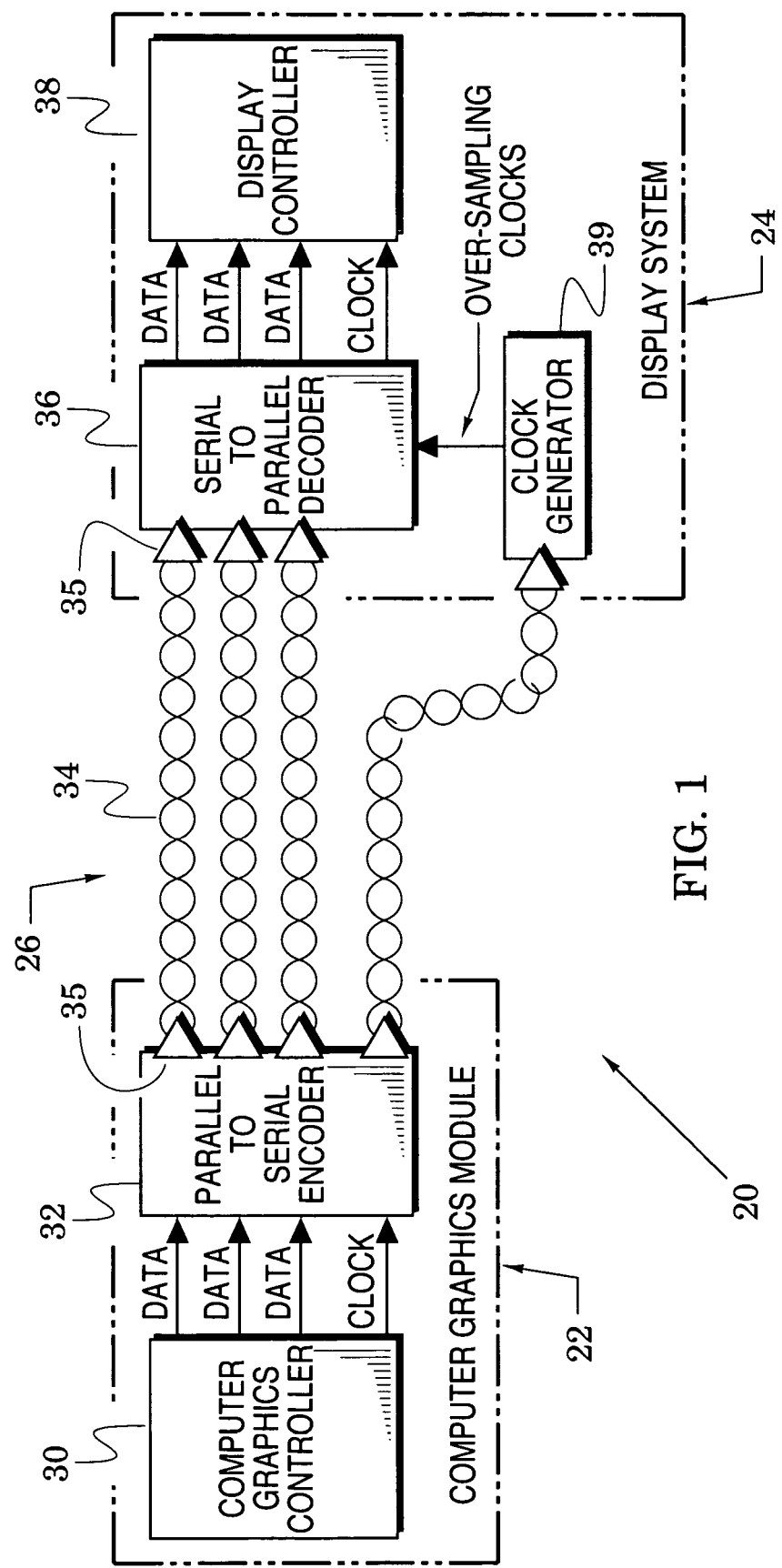
FIG. 1 is a block diagram of a display interface system of the present invention.

In particular, a display interface system 20 is shown in FIG. 1 to include a computer graphics module 22, a display system 24 and a data transmission structure 26 that carries data between the modules. In the computer graphics module, a computer graphics controller 30 sends digital data and a clock signal to a parallel-to-serial encoder 32. In the case of color display systems, the digital data is generally organized in three data bit streams which represent red, green and blue display information.

In a system embodiment, each of the red, blue and green data from the computer graphics controller is organized in 8-bit words and the encoder 32 preferably uses an algorithm that transforms these words to 10-bit TMDS serial words. The TMDS words and the clock signal are sent over the data transmission structure 26 which preferably includes twisted pair wires 34 coupled between buffer amplifiers 35.

The display module 24 includes a serial-to-parallel decoder 36, a display controller 38 and a clock generator 39. The clock generator provides over-sampling clocks to the decoder 36 in response to the encoder's clock signal. The decoder uses the over-sampling clocks to recover and decode the red, blue and green digital data, synchronize them to a single data clock and provide these to the display controller which generates a corresponding graphic image on the display module's display (not shown).

Figure 2:
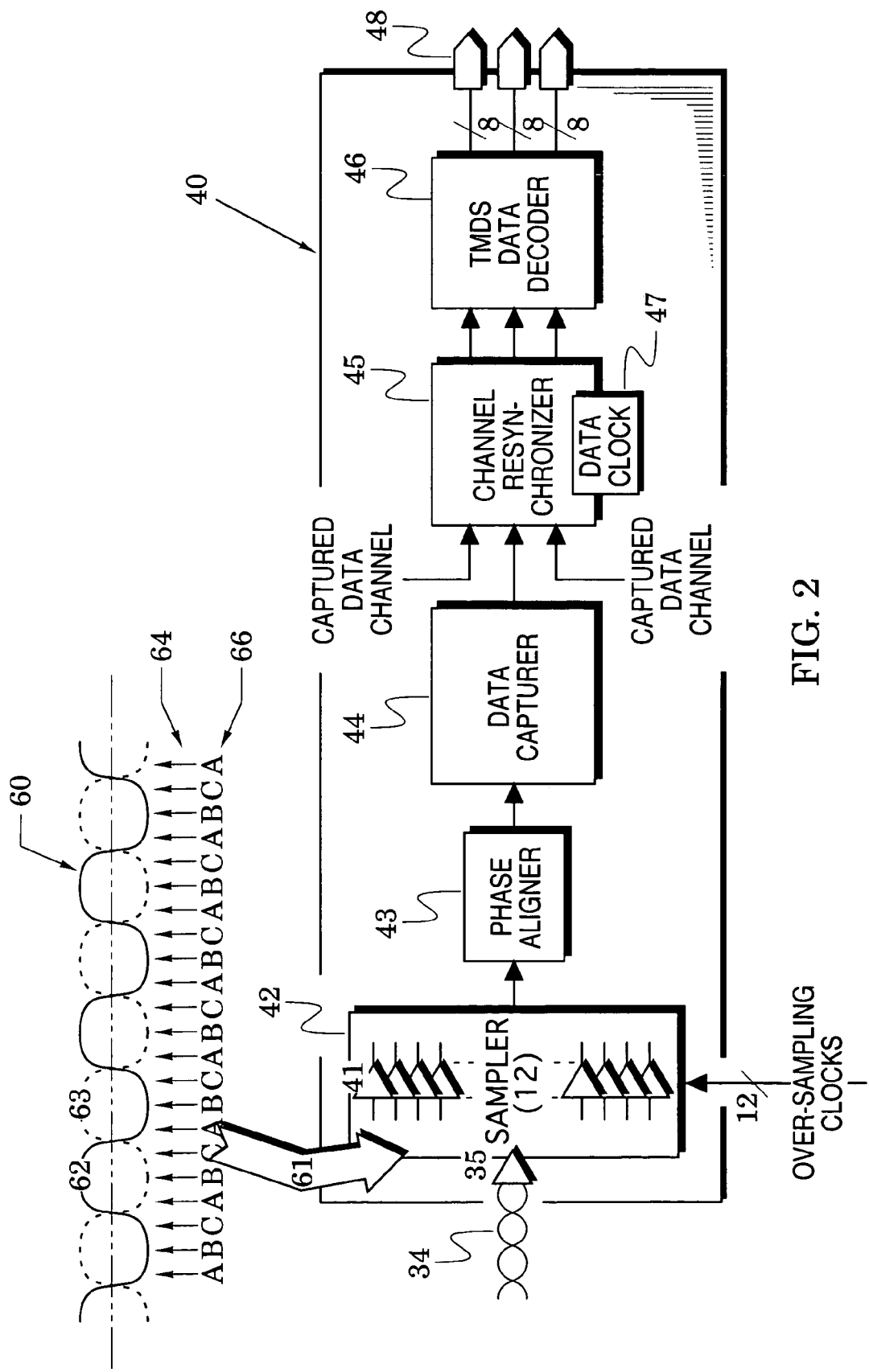
FIG. 2 is a block diagram of a serial-to-parallel decoder embodiment in the system of FIG. 1.

An embodiment of the serial-to-parallel decoder 36 is shown in FIG. 2 as a decoder 40 which includes a sampler system 42, a phase aligner 43, a data capturer 44, a channel resynchronizer 45 and a TMDS data decoder 46. The sampler system 42 has a series of samplers which receive over-sampling clocks from the clock generator (39 in FIG. 1). In the embodiment shown, twelve samplers each receive a respective one of the over-sampling clocks which are spaced apart by a predetermined phase interval.

As indicated by an arrow 61, each of the incoming TMDS signals 60 is a differential signal formed by the difference between first and second signals (e.g., potentials or currents) 62 and 63 respectively shown in solid and broken lines. Using the solid line as a reference, the TMDS signal is shown to have an exemplary sequence of alternating logic ones and zeros. In the embodiment shown in FIG. 2, there are twelve samplers that each respond to a respective one of twelve over-sampling clocks which are indicated by sampling arrows 64.

The clock signals are arranged to oversample the data bit stream (i.e., the TMDS signal) by an oversample factor N, i.e., the clock signals occur at a clock rate that is N times the bit rate in the data bit stream. In FIG. 2, N=3 and the clock signals are arranged so that each group of 3 clocks will extract samples of a respective one of the bits in the data bit stream. Every third one of the samples is considered to comprise one bit sampling phase of a group of three phases A, B and C. Accordingly, the sampling arrows 64 are accompanied by phase indicators 66.

When N=3 and twelve samplers are used, the sampler system 42 provides phase samples of four bits of the data bit stream each time it receives the twelve over-sampling clocks which can be generated by the exemplary clock generator of FIG. 3A. This generator is a fractional phase-lock loop 70 that includes a phase detector 72, a filter 73, a voltage-controlled oscillator (VCO) 74 and a frequency divider 75 arranged in a feedback loop. The fractional phase-lock loop also includes a frequency divider 76 that is coupled to the phase detector.

In operation, the frequency divider 76 divides the clock by a factor R and couples this divided signal to the phase detector. The frequency divider 75 divides by a factor S and couples a feedback signal from the VCO to the phase detector. In response to these signals from the frequency dividers, the phase detector provides a control signal through low-pass filtering of the filter to the VCO. Accordingly, the action of the feedback loop causes the synthesized frequency from the VCO to be $(S/R)F_{clk}$ wherein $F_{clk}$ is the clock's frequency. Thus, the clock generator 70, with appropriate selections of S and R, can provide a signal whose frequency is set to conform to the frequency of the bits from the encoder (32 in FIG. 1).

As shown in FIG. 3B, one embodiment of the VCO 74 is a set of time delays 77 arranged in a closed loop 78. The VCO's control signal (from the filter 73 of FIG. 3A) varies the selectable delay of the delays 77 to thereby control the VCO's frequency. Tap points after each delay can be brought out to provide signal phases $\phi_1, \phi_2 - - - \phi_n$ which are the over-sampling clocks of FIG. 2.

The phase aligner 43 of FIG. 2 temporally aligns (e.g., with a set of flip-flops and strobed latches) the outputs of the sampler system 42 to provide a bit sample subsequence such as the bit sample subsequence 100 of FIG. 4. The subsequence comprises 12 bit samples which correspond to four bits in the data bit stream 60 of FIG. 2. Because this data bit stream is shown to have well-defined pulses (not always the case) and the over-sampling clocks 64 are well aligned to place three clocks on each bit, the bit sample subsequence 100 has alternating sets of three zeros and three ones so that correct data could be formed from any of the three bit sample phases A, B and C.

FIG. 4 also shows a successive bit sample subsequence 102 (which has a different pattern of zeros and ones) which has also been temporally aligned and which has, in addition, been temporally aligned with the bit sample subsequence 100 to form a larger bit sample sequence 106. This temporal arranging of subsequences is realized in a stacker portion of the phase aligner 43 of FIG. 2. In a similar manner, a look-back sequence (a prior sequence) 104 and a look-ahead sequence (a subsequent sequence) 108 have also been generate by the sampler system 42 and the phase aligner 43.

The sampler system 42 and the phase aligner 43 thus provide successive bit sample sequences (as shown in FIG. 4) in response to a data bit stream received from the encoder (32 in FIG. 1) and the data capturer 44 of FIG. 2 is configured to capture data from the successive bit sample sequences. FIG. 5A, for example, shows a flowchart 120 which illustrates exemplary processes that are performed by the data capturer.

In a first process step 122, successive bit sample sequences are generated from the data bit stream wherein the sequences each comprise N interleaved bit sample phases. This step is performed by the sampler system 42 and the phase aligner 44 of FIG. 2 and FIG. 5B illustrates an exemplary result wherein successive bit sample sequences 130, 132 and 134 (a look-back sequence, a current sequence and a look-forward sequence) are presented.

In process step 123 of FIG. 5A, subsampling strings are identified in the bit sample sequences that have less than N (i.e., 3 in the current embodiment) consecutive bit samples with the same bit sample value. When N=3, a subsampling string is any number of consecutive bit samples, e.g., two or one, that are less than three. In FIG. 5B, a subsampling string 136 (having one zero) is identified and it is noted that no other subsampling strings (having less than N consecutive bit samples with the same bit sample value) occur.

Process step 124 of FIG. 5A invalidates the bit sample phase of any bit sample that adjoins the string (or strings) identified in step 123. It is noted in FIG. 5B that bit sample phases A and C adjoin the string 136 and so they are invalidated. This has been indicated by changing phase letters A and C to lower case and leaving the phase letter B in upper case. Finally, process step 125 forms data from any bit sample phase that remains valid after the invalidating step. Accordingly, data is formed in FIG. 5B by using the bit sample phase B and processing it through the data capturer 44 of FIG. 2.

In the example of FIG. 5B, the invalidating step 124 of FIG. 5A leaves only one bit sample phase valid (phase B). FIG. 6A shows a flowchart 140 which addresses the case in which the invalidating step provides a plurality of valid bit sample phases. This is illustrated with successive bit sample sequences 150, 152 and 154 wherein a subsampling string 156 of two zeros that belong to bit sample phases A and B. Accordingly, process step 124 of FIG. 5A invalidates bit sample phase C. This is indicated by changing phase letter C to lower case and leaving phase letters A and B in upper case. In accordance with process step 125 of FIG. 5A, data can now be formed with a selected one of bit sample phases A and B.

Although data can now be formed from either bit sample A or B, FIG. 6A shows a flowchart 140 which illustrates another data capture embodiment. In a process step 142, a preferred valid bit sample phase is identified as one having a bit sample in one of the strings that does not immediately follow a transition from one bit sample value to a different bit sample value. Such transitions are indicated in FIG. 6B by horizontal broken lines 158. Because the bit sample B in the subsampling string 136 does not immediately follow a transition (as does a bit sample A), bit sample phase B is the preferred bit sample phase. Process step 143 of FIG. 6A then forms data from this preferred bit sample phase.

The flowchart 144 of FIG. 6B illustrates a more general method of forming data. In a process step 146 of this flowchart, a preferred valid bit sample phase is identified as one whose bit samples least often adjoin transitions from one bit sample value to a different bit sample value. This step is realized by counting how often the bit samples of each bit sample phase adjoin the transitions 158 in FIG. 6B. This count can be conducted over the current bit sample sequence 152 but is preferably conducted over more sequences (e.g., the successive bit sample sequences 150, 152 and 154). Because the bit samples of bit sample phase B adjoin the transitions 158 less often than do the bit samples of the other bit sample phases, it is the preferred bit sample phase in FIG. 6B.

As recited above, FIGS. 5A, 5B and 6A-6C illustrate methods of the invention for capturing data from the data bit stream which enters the sampler system 42 in FIG. 2. In an important feature of the invention, these methods invalidate bit sample phases and form data from the remaining valid bit sample phase (or phases). Although any remaining valid bit sample phase can be used, FIGS. 6A-6C illustrate a capture embodiment that selects a preferred one of the valid bit sample phases.

As described above, FIG. 2 shows an exemplary relationship between a data bit stream 60 and oversampling clocks 64. If this relationship alters, a change will probably occur first in either bit sample phase A or C. For example, an initial pattern of 000 for phases ABC will change to 100 or 001—a portion of the latter pattern being the subsampling string 156 of FIG. 6B. In this case, it is apparent that bit sample phases A and B can be used to form data but that bit sample phase B is probably the preferred phase as it is more centered in its corresponding bit sample.

If the shape of the bits in the data bit stream degrades, a change will likely occur first in one or both of bit sample phase A and C which leads to a subsampling string such as the string 136 of FIG. 5B. In this case, it is apparent that bit sample phase B should be used to form data and, accordingly, the methods of the invention invalidate bit sample phases A and C.

It has been found that the invalidating processes illustrated in FIGS. 5A, 5B and 6A-6C (and their subsequent determination of a valid bit sample phase) lead to reliable capture of data from oversampled data bit streams. It has also been found effective to divert a copy of the bit sample sequences along a delay path as the processing of FIGS. 5A, 5B and 6A-6C is carried out. Once a valid bit sample phase has been identified, that bit sample phase can be selected (e.g., multiplexed) from the delay path and passed to the channel resynchronizer 45 in FIG. 2 along with selected bit sample phases from the other captured data channels.

These delay path concepts are illustrated in the flowchart 160 of FIG. 6D in which process step 162 temporally delays the bit sample sequences (along a delay path) to facilitate the identifying and invalidating steps (123 and 124 of FIG. 5A, 142 of FIG. 6A and 146 of FIG. 6B). Process step 164 subsequently extracts a selected bit sample phase from the bit sample sequences (on the delay path.

The sampler system 42 of FIG. 2 thus oversamples successive portions of the data bit stream and the phase aligner 43 organizes the samples into bit sample sequences such as the sequence 132 of FIG. 5B. It has also been found effective to accompany the processing of a current bit sample sequence (e.g., 132) with the processing of a look-behind sequence (e.g., 130) and a future look-ahead sequence (e.g., 134) that respectively precede and succeed the current sequence. The selected bit sample phase is typically extracted from the current sequence as a copy of it travels along the delay path.

In a first operational mode of the invention, all three of these bit sample sequences are inspected, bit sample phases invalidated and validated, and a resultant valid bit sample phase extracted from the current bit sample sequence. The look-ahead sequence provides the opportunity to sense problematic bit sample phases and invalidate them in the current bit sample sequence. Once the invalid situation has progressed into the past (i.e., is no longer present in the look-back sequence), the invalidated bit sample sequence is then restored to valid status. Thus, problematic phases are invalidated before they occur in the current bit sample sequence and are quickly restored to valid status as soon as they pass the look-back state. This first operational mode has been found to be especially useful during and shortly after startup of the display system 24 of FIG. 1.

Once the system has settled, a second operational mode has been found effective. In this second mode, the look-ahead, current and look-back bit sample sequences are inspected and acted on as in the first operational mode. However, invalidated bit sample phases are not returned to valid status but remain invalid as long as the system remains in the second operational mode. If all bit sample phases become invalid, the system transfers back into the first operational mode. The second operational mode is particularly suited for steady state operation of the system but the first operational mode is preferable during transitory problems (e.g., bursts of noise or spurious signals) after which the system can be returned to the second operational mode.

Figure 7:
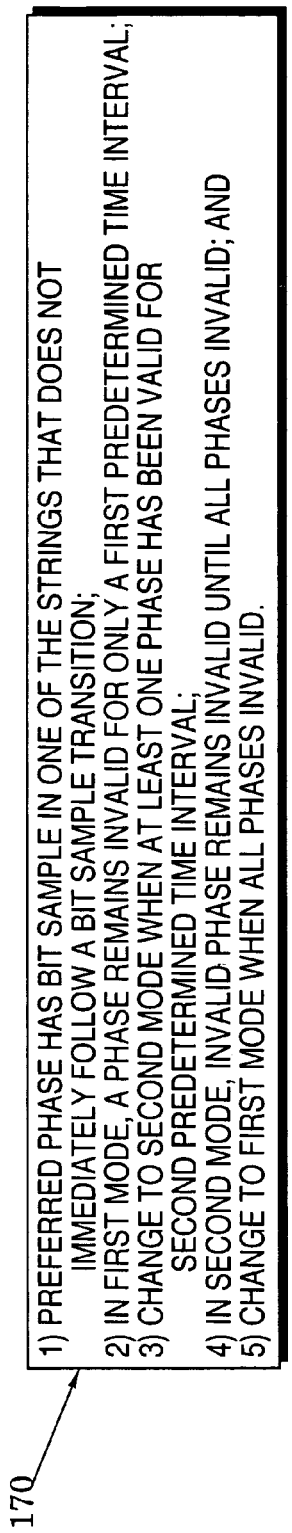
FIG. 7 is a list of further process embodiments in the decoder of FIG. 2.

These operational embodiments are summarized in the list 170 of FIG. 7 which recites:
1) a preferred valid phase is one having a bit sample that does not immediately follow a bit sample transition (alternatively, one that least often adjoins a transition),
2) in a first operational mode, a phase remains invalid for only a first predetermined time interval,
3) change to a second operational mode when at least one phase has remained valid for a second predetermined time interval,
4) in the second operational mode, invalid phases remain invalid until such time they all become invalid, and
5) change from the second mode to the first mode when all phases become invalid.

Changes that include all of the bit sample phases can cause disturbances in the operation of the TMDS decoder 46 of FIG. 2 because it may not be clear if a shift from one phase to another results from overflow and underflow conditions (described below with respect to FIGS. 9A-9D and referred to there as carry and borrow modes). In an embodiment of the invention that limits the bit sample phases under consideration, a bit sample phase is therefore invalidated if more than one of the other bit sample phases have been the only valid bit sample phase during a time interval. If, for example, bit sample phase A has remained valid for a time interval during which bit sample phase C and B have been invalid, and then later bit sample phase C has remained valid for a time interval during which bit sample phase A and B have been invalid, then it is likely that bit sample phase B can be removed from consideration without adversely affecting the formation of data. Changes will subsequently be limited to those between bit sample phases A and C (until some other valid/invalid condition arises to alter this limitation or until the operational mode changes).

Figure 8:
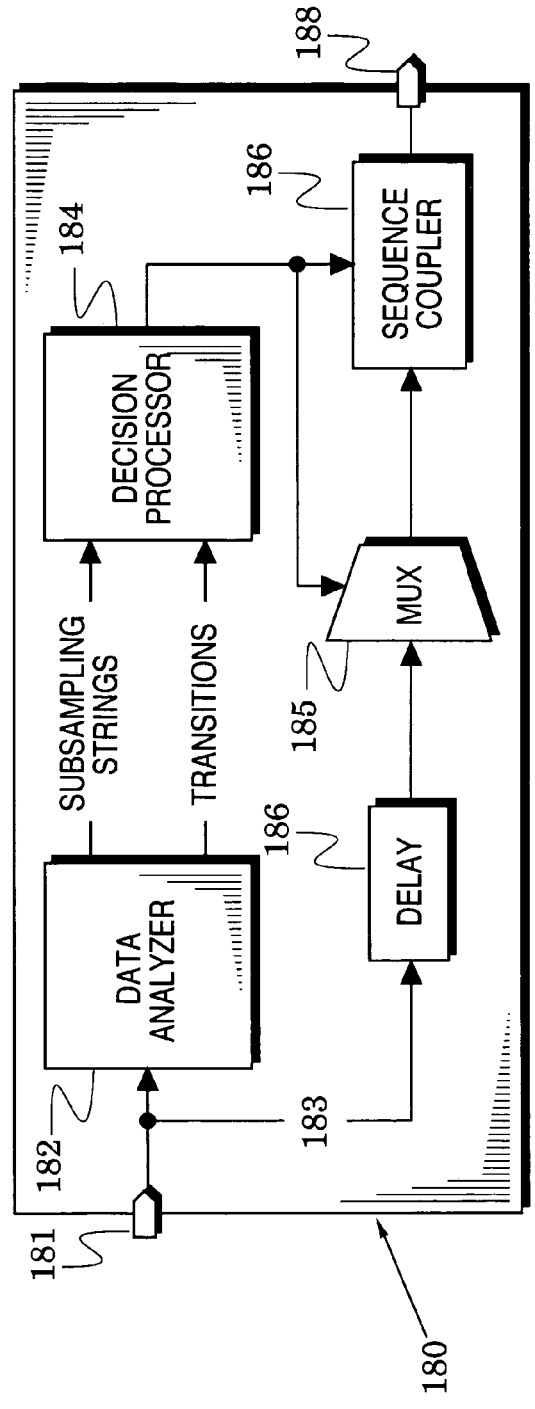
FIG. 8 is a block diagram of a data capturer embodiment in the decoder of FIG. 2.

The data capturer 44 of FIG. 2 can be configured or partitioned in various ways to carry out the methods of the invention. FIG. 8 illustrates an embodiment 180 that includes an input port 181, a data analyzer 182, a delay path 183, a decision processor 184, a delay 186, a multiplexer 185 and an output port 188. The delay and multiplexer are coupled along the delay path between the input and output ports. The decision processor is coupled to the output port and the data analyzer is coupled between the input port and the decision processor.

The data analyzer 182 is configured to analyze the incoming data bit stream to thereby identify subsampling strings (e.g., 136 and 156 in FIGS. 5B and 6B) and transitions between bit sample values (158 in FIG. 6B). The decision processor 184 is configured to receive these identifications and, in response, invalidate bit sample phases and identify preferred valid bit sample phases and/or only valid bit sample phases in accordance with the method and process embodiments described above. Once the decision processor 184 has selected a bit sample phase that remains valid for a current bit sample sequence (after the invalidating processes), it passes that selection to the multiplexer 185 which multiplexes a copy of the current bit sample sequence out of the delay path 183 and sends it to the output port 188.

The decision processor next selects a valid bit sample phase for the succeeding bit sample sequence and passes that selection to the multiplexer which multiplexes a copy of the succeeding bit sample sequence out of the delay path and sends it to the output port. At the boundary between the current bit sample phase and the succeeding bit sample phase, some changes from one selected valid bit sample phase to a different bit sample phase may endanger the loss of a bit sample.

This is illustrated in the diagram 200 of FIG. 9A which indicates a boundary 206 between a current bit sample sequence 202 and a succeeding bit sample sequence 204 (this figure and FIGS. 9B-9D are enlargements of the area within the curved line 9 in FIG. 5B). The letters A are capitalized in the sequence 202 to indicate that phase A is the selected valid bit sample phase and the letters C are capitalized in the sequence 204 to indicate that phase C is subsequently the selected valid bit sample phase. There are eight A bit samples in the sequence 202 and it is said to be in a "normal" mode.

It is noted that a jump from the last A bit sample in the bit sample sequence 202 to the first subsequent A bit sample in the bit sample sequence 204 represents a normal bit sample width. Stretching this jump to the following B bit sample would generally approach the edge of the bit sample but stretching the jump to the following C bit sample would generally miss a bit sample.

To avoid missing a bit sample, the invention selects A bit samples in the current bit sample sequence 202 as indicated by horizontal arrows 207, selects C bit samples in the succeeding bit sample sequence 204 and adds a bit sample of the current bit sample phase after the boundary as indicated by arrow 208 so that all bit samples will now be processed in the succeeding bit sample sequence. Because the initial A bit sample was added, the bit sample sequence 204 has nine bit samples (one A bit sample and eight C bit samples) and essentially it donates, i.e., carries, its last C bit sample (not shown) to the succeeding bit sample sequence. Each succeeding sequence can be said to now be in a "carry" mode in which its last C bit sample is carried over into the succeeding sequence.

The diagram 210 of FIG. 9B illustrates a later situation in which the letters C are capitalized in a sequence 212 to indicate that phase C is still the selected valid bit sample phase (and is still in its carry mode) and the letters A are capitalized in the sequence 214 to indicate that phase A is subsequently the selected valid bit sample phase. It is noted that stretching a jump from the next-to-last C bit sample in sequence 212 to the first A bit sample in sequence 214 will not miss a bit sample (whereas a jump from the last C bit sample would).

It is also noted that bit sample sequence 212 is still in a carry mode and would have carried its last C bit sample over to the succeeding bit sample sequence 214 if phase C were to remain the selected valid bit phase. It is apparent that the last C bit sample of the current bit sample phase before the boundary 206 is not needed and is thus deleted which changes operation back to a normal mode from the carry mode.

The diagram 220 of FIG. 9C illustrates a later situation in which the letters C are capitalized in a sequence 222 to indicate that phase C is again the selected valid bit sample phase and the letters A are capitalized in the sequence 224 to indicate that phase A is subsequently the selected valid bit sample phase. The sequence 222 is still in the normal mode. A jump from the last C bit sample to the first A bit sample in the succeeding sequence 224 would generally miss a bit sample so the jump goes instead to the second A bit sample as indicated by arrow 225. Because a bit sample of the succeeding bit sample phase is deleted after the boundary 206, there will be seven A bit samples in the sequence 224 so that it borrows one from its succeeding sequence (not shown). It is therefore said to operate in a "borrow mode".

Finally, the diagram 230 of FIG. 9D illustrates a situation in which the letters A are capitalized in a sequence 232 to indicate that phase A is still the selected valid bit sample phase and the letters C are capitalized in the sequence 234 to indicate that phase C is subsequently the selected valid bit sample phase. The sequence 232 is still in the borrow mode. It is noted that a jump from the last A bit sample to the first C bit sample in the succeeding sequence 234 would generally miss a bit sample so the jump goes instead to the first A bit sample as indicated by arrow 235. Essentially, this bit sample is borrowed from the sequence 234 which but this sequence returns once again to the normal mode because it will contain eight C bit samples.

To properly couple the sequences that are multiplexed from the delay path 183 in FIG. 8, the data capturer 180 includes a sequence coupler 186 which is inserted to insure that no bit samples are missed at the sequence boundaries (206 in FIGS. 9A-9D. In particular, the sequence coupler 186 is configured to include the processes illustrated in FIGS. 9A-9C that successive sequences by appropriately changing between normal, carry and borrow operational modes.

As described above, the data capturer 44 of FIG. 2 thus provides a captured data channel and two other sampler systems 42, phase aligners 43 and data capturers 44 provide the other two captured data channels to a channel resynchronizer 45 that synchronizes all three color channels to a common data clock 47. A TMDS data decoder 46 then uses the two added bits of the TMDS words to capture the words and convert them to 8-bit data words similar to those that entered the parallel-to-serial decoder 32 of FIG. 1. These 8-bit words are provided through an output port 48 to the display controller 38 of FIG. 1.

To carry out the method embodiments of the invention, data capturer embodiments (e.g., 180 in FIG. 8) can be realized with various circuits such as arrays of logic gates, appropriately-programmed digital processors and combinations thereof.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A method of capturing data from a data bit stream, comprising the steps of:
    from said data bit stream, generating, with a sampler system, successive bit sample sequences that each comprise N interleaved bit sample phases, wherein N is an integer;
    in said bit sample sequences, identifying, with a data capturer, subsampling strings formed of less than N consecutive bit samples with the same bit sample value;
    with said data capturer, invalidating the bit sample phase of any bit sample that adjoins said strings; and
    with said data capturer, forming data with successive bit sample phases that remain valid after said invalidating step;
    wherein said identifying step includes the steps of:
    with a data analyzer, identifying transitions from one bit sample value to a different bit sample value; and
    with a decision processor, identifying valid bit sample phases in response to said subsampling strings and said transitions;
    and wherein said forming step includes the steps of:
    diverting and delaying a copy of said bit sample sequences along a delay path of a delay circuit to facilitate said identifying and invalidating steps; and
    with a multiplexer that responds to said decision processor, subsequently extracting a valid bit sample phase from said delay path to thereby form said data.

2. The method of claim 1, wherein said invalidating step provides a plurality of valid bit sample phases and said forming step includes the steps of:
    from said valid bit sample phases, identifying a preferred valid bit sample phase as one whose bit samples least often adjoin said transitions; and
    forming said data with said preferred valid bit sample phase.

3. The method of claim 1, wherein said invalidating step provides a plurality of valid bit sample phases and said forming step includes the steps of:
    from said valid bit sample phases, identifying a preferred valid bit sample phase as one having a bit sample in one of said strings that does not immediately follow one of said transitions; and
    forming said data with said preferred valid bit sample phase.

4. The method of claim 1, wherein said extracting step includes the step of multiplexing said valid bit sample phase from said delay path.

5. The method of claim 1, wherein said generating step includes the step of temporally aligning the bit samples of said bit sample sequences.

6. The method of claim 1, wherein said generating step includes the step of oversampling successive portions of said data bit stream by an oversampling factor N.

7. The method of claim 1, wherein said generating step includes the steps of:
    oversampling successive portions of said data bit stream by an oversampling factor N to provide bit sample subsequences; and
    forming said bit sample sequences with a plurality of successive bit sample subsequences.

8. The method of claim 7, wherein N is three.

9. The method of claim 7, wherein N is three and said plurality is two.

10. The method of claim 7, wherein said oversampling step includes the steps of:
    successively delaying an oscillator signal to form a plurality of delayed sample clocks; and
    sampling said data bit stream in response to said delayed sample clocks.

11. The method of claim 1, further including the steps of:
    after a predetermined time interval, returning a bit sample phase invalidated in said invalidating step to a valid state; and
    subsequently continuing said invalidating and forming steps.

12. The method of claim 1, further including the steps of:
    subsequent to all bit sample states becoming invalid, returning all bit sample phases to a valid state; and
    subsequently continuing said invalidating and providing steps.

13. The method of claim 1, wherein said invalidating step includes the step of invalidating a bit sample phase if more than one of the other bit sample phases have been the only valid bit sample phase during a time interval.

14. The method of claim 1, wherein, to insure that said data includes all data bits of said data bit stream, said forming step includes the step of including, at a boundary between a current bit sample sequence having one valid bit sample phase and a succeeding bit sample sequence having a different valid bit sample phase, a selected one of the actions of:
    add a bit sample of said current bit sample phase after said boundary;
    delete a bit sample of said current bit sample phase before said boundary and
    delete a bit sample of said succeeding bit sample phase after said boundary.

15. The method of claim 1, wherein said successive bit sample sequences include a look-back sequence, a current sequence and a look-ahead sequence.

16. The method of claim 1, wherein said subsampling strings include strings formed by a single bit sample.

17. A serial-to-parallel decoder that captures data from a data bit stream in response to a corresponding clock signal, comprising:
    a sampler system that, in response to said clock signal, generates successive bit sample sequences from said data bit stream which each comprise N interleaved bit sample phases wherein N is an integer; and
    a data capturer configured to:
    a) identify, in said bit sample sequences, subsampling strings formed of less than N consecutive bit samples with the same bit sample value;
    b) invalidate the bit sample phase of any bit sample that adjoins said strings; and
    c) form data with successive bit sample phases that remain valid;
    wherein said data capturer includes:
    a data analyzer configured to identify said subsampling strings and identify transitions from one bit sample value to a different bit sample value;
    a decision processor that identifies valid bit sample phases in response to said subsampling strings and said transitions;
    a delay circuit that delays copies of said bit sample sequences; and a multiplexer that responds to said decision processor and extracts successive valid bit sample phases from said copies to thereby form said data.

18. The decoder of claim 17, wherein N is three.

19. The decoder of claim 17, wherein said subsampling strings include strings formed by a single bit sample.

20. The decoder of claim 17, wherein said data capturer provides a plurality of valid bit sample phases and is further configured to:
  identify a preferred valid bit sample phase as one that least often adjoins a transition from one bit sample value to a different bit sample value; and
  form said data with said preferred valid bit sample phase.

21. The decoder of claim 17, wherein said sampler system includes:
  an oscillator that provides a plurality of successively delayed over-sampling clocks in response to said clock signal; and
  a plurality of samplers that oversamples said data bit stream in response to said over-sampling clocks.

22. The decoder of claim 21, wherein said sampler system further includes a phase aligner that temporally aligns said bit sample sequences.

23. The decoder of claim 17, wherein said data capturer further includes a sequence coupler that receives valid bit sample phases from said multiplexer and, at a boundary between a current valid bit sample phase and a different succeeding valid bit sample phase, responds to said decision processor by performing one of the actions of:
  adding a bit sample of said current bit sample phase after said boundary;
  deleting a bit sample of said current bit sample phase before said boundary; and
  deleting a bit sample of said succeeding bit sample phase after said boundary;
  that is selected to insure said data includes all data bits of said data bit stream.

24. The decoder of claim 17, wherein said data capturer is further configured to:
  after a predetermined time interval, return a bit sample phase invalidated in said invalidating step to a valid state; and
  subsequently continue to invalidate the bit sample phase of any bit sample that adjoins said strings and form data with successive bit sample phases that remain valid.

25. The decoder of claim 17, wherein said data capturer is further configured to:
  subsequent to all bit sample states becoming invalid, return all bit sample phases to a valid state; and
  subsequently continue to invalidate the bit sample phase of any bit sample that adjoins said strings and form data with successive bit sample phases that remain valid.

26. The decoder of claim 17, wherein said data capturer is further configured to invalidate a bit sample phase if more than one of the other bit sample phases have been the only valid bit sample phase during a time interval.

\* \* \* \* \*